United States Patent [19]
Beesley

[11] Patent Number: 5,849,371
[45] Date of Patent: Dec. 15, 1998

[54] LASER AND LASER-ASSISTED FREE ELECTRON BEAM DEPOSITION APPARATUS AND METHOD

[76] Inventor: Dwayne Beesley, 190 Main St., New Canaan, Conn. 06840

[21] Appl. No.: 681,231

[22] Filed: Jul. 22, 1996

[51] Int. Cl.[6] .................................................. C23C 14/00
[52] U.S. Cl. .................. 427/566; 427/596; 118/723 EB; 118/726
[58] Field of Search ............................ 118/726, 723 EB; 427/566, 596

[56]  References Cited

U.S. PATENT DOCUMENTS

| | | |
|---|---|---|
| 4,152,478 | 5/1979 | Takagi . |
| 4,281,030 | 7/1981 | Silfvast . |
| 4,604,293 | 8/1986 | Shirahata et al. . |
| 4,799,454 | 1/1989 | Ito . |
| 4,816,293 | 3/1989 | Hiramoto et al. . |
| 4,836,140 | 6/1989 | Koji ......................................... 118/722 |
| 5,085,166 | 2/1992 | Oka ......................................... 118/726 |
| 5,302,208 | 4/1994 | Grimm ..................................... 118/726 |
| 5,316,585 | 5/1994 | Okamoto ................................. 118/726 |
| 5,478,398 | 12/1995 | Nakanishi ............................... 118/726 |

*Primary Examiner*—Richard Bueker
*Attorney, Agent, or Firm*—St.Onge Steward Johnston & Reens

[57]  ABSTRACT

A laser and laser-assisted multi-beam deposition apparatus for evaporating and/or sublimating a material to deposit on a substrate comprises using a laser and an electron beam, or two lasers, simultaneously applied to the material to vaporize the material with reduced ejection of material particulates and reduced oxidation of the material. The apparatus and method is particularly useful in the processing of blanket refractory metal depositions on large flat panel display substrates, silicon wafer substrates, and tribological/ceramic coatings.

23 Claims, 4 Drawing Sheets

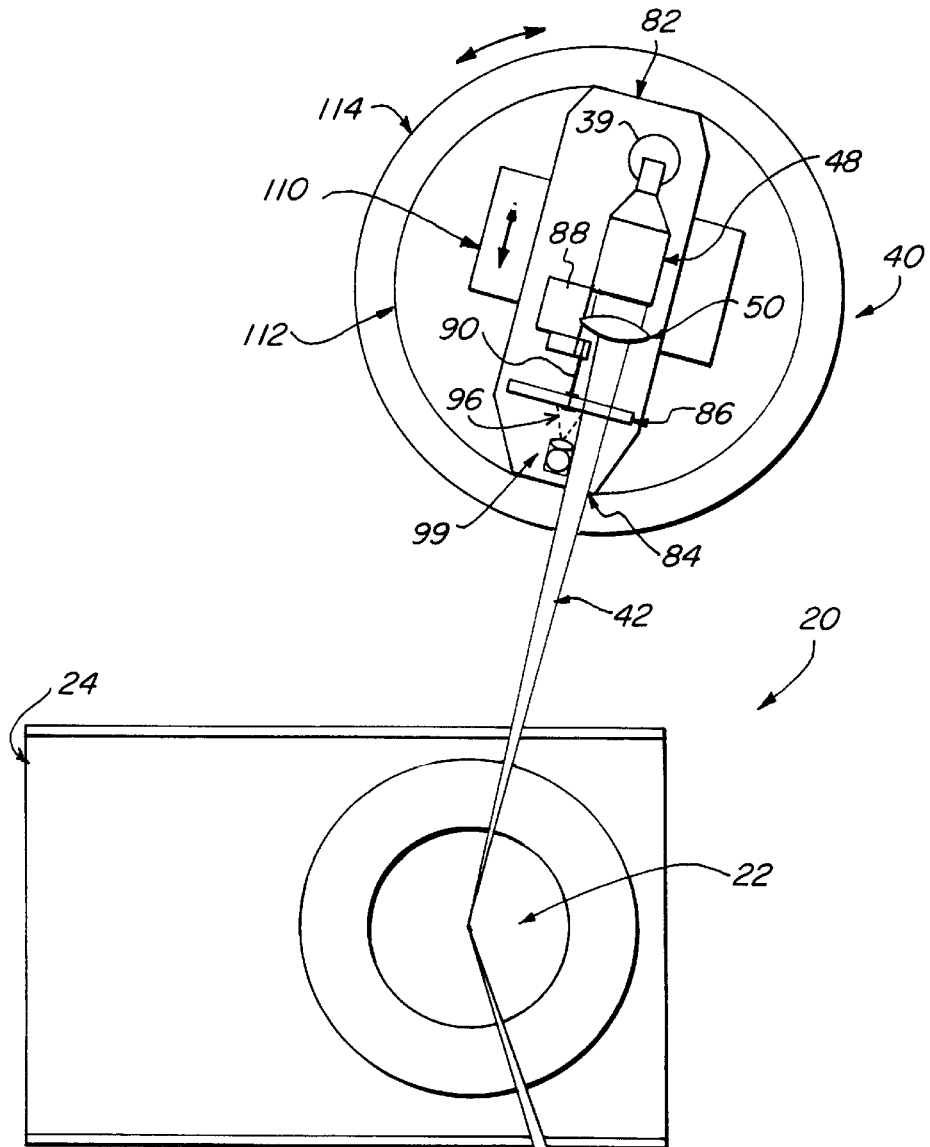
FIG. 4
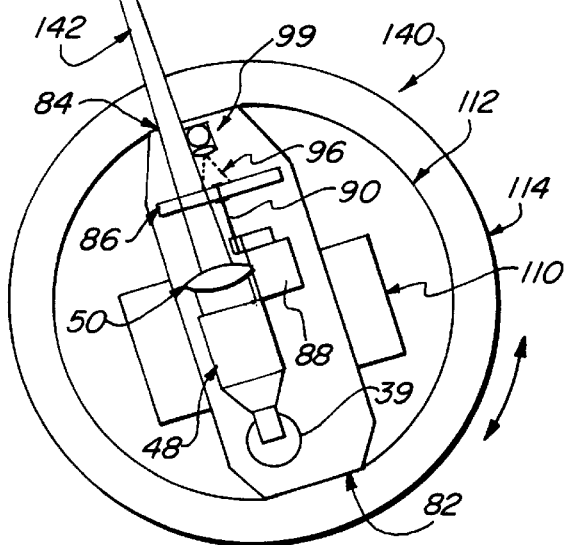

LASER AND LASER-ASSISTED FREE ELECTRON BEAM DEPOSITION APPARATUS AND METHOD

FIELD OF THE INVENTION

The present invention relates to the field of vapor deposition of low impedance, refractory metal thin films and/or ceramic tribological and thermal barrier coatings on various substrates, which can be used in the manufacture of electronic components, such as integrated circuits and flat panel displays as well as generally in the coating of products with such films in the aerospace, industrial tooling and automotive industries.

BACKGROUND OF THE INVENTION

Electron beam deposition processes are typically used in the manufacture of products where it is desired to coat a thin film of a material on a substrate. This process is widely used in the manufacture of optics and/or displays to deposit a thin film of a material or compound, such as magnesium oxide [MgO] onto a glass substrate. In conventional processes, as illustrated in FIG. 1, an electron gun 10 is used to generate an electron beam 12, which is directed by magnetic fields to a crucible 14, located in a vacuum chamber, containing the material or compound 16. The crucible is a water cooled hollow vessel that is continuously cooled. The energy of the electron beam 12 causes the material 16 to evaporate, (or in the case of MgO, to sublimate), forming a molecular vapor flux of atoms or molecules, atomic ions, clusters of atomic ions, and/or molecular ions, depending on the material.

As used herein the terms "vaporization", "vaporizing", and/or "vaporized" will be used to refer to both sublimation and evaporation processes, since the invention herein is applicable to creating a molecular vapor flux whether the material to be vaporized is a material which can be sublimated (changing directly from a solid phase to a vapor phase), or is a material which first changes to a liquid phase and then evaporates to change to the vapor phase.

The vaporized material or ions rise from the crucible and condense and form a film or coating on the substrate 18, located above the crucible 14. The film thickness is typically controlled by controlling the energy of the electron beam 12 and the length of time it is operated. When the electron beam 12 is turned off, the vapor deposition process terminates almost instantaneously.

A problem with such processes is that the vaporized material will tend to coat everything in its path. Thus, as shown in FIG. 1, the electron source filament 17 is shielded with a stainless steel shield 19 and the path of the electron beam is curved by magnetic fields to target the crucible 14.

Conventional electron beam deposition processes are adequate when substrates are to be coated with nonconductive, refractory metal thin films or other compounds and/or materials such as hard coatings on tooling or machine parts.

However, when low impedance refractory metal conductive films are desired, such as in the manufacture of electronic components, e.g., silicon wafer blanket-metal or via-fill, conventional E-beam systems are not used because of significant problems. The electron gun processes are typically unacceptable for manufacture of electronic components because current electron gun equipment emits "soft" X-rays. Electronic components such as silicon wafers are sensitive even to "soft" X-rays which will damage the component.

Under current technology, substrates for electronic components are typically coated using chemical vapor deposition (CVD) systems in which a metalorganic precursor is injected into a reactor, where it is reduced to form a thin metal film coating on a substrate. Such systems are very expensive, and the reactive metalorganic precursors are difficult and dangerous to handle, as they are typically pyrophoric. Moreover, the process requires cleaning of the reactor between each individual substrate deposition to remove contaminants. This reduces throughput through the CVD system.

In addition, there are practical problems associated with electron beam deposition processes, especially as used in the coating of larger size substrates. These problems are particularly acute when the product to be manufactured is a large substrate.

The problem of trying to attain film deposition on large substrates is basically attributable to the limitations on the rate of deposition of refractory metals on the substrate that are inherent in electron beam deposition equipment. Where larger and/or numerous substrates are to be coated, the molecular vapor flux has a longer path to travel to reach the substrate. This longer path means the deposition process requires additional time to be completed, due to the fact that the rate decreases by the square of the distance from the source to the substrate. This additional time causes several problems. Most significantly, oxidation of the metal thin film occurs. It is to be appreciated that, even in a vacuum chamber, there will be residual oxygen available for oxidation within the chamber. If a low impedance refractory metal thin film were to be deposited, the metal oxides would cause the thin film to have a higher resistivity than it would otherwise have. This decreased electrical conductance would limit the efficiency of the component.

Larger substrates with low impedance refractory metal films may include flat panel displays which are used where low weight and thin displays are desirable. Flat panel displays may be used in laptop computers, automobiles, and in aircraft, especially military aircraft and helicopter displays. Other flat panel display applications include scientific, medical, industrial instruments, wall hanging TV's and PC workstation monitors. In the case of a flat panel display, the described oxidation problems will cause the display to have a lower luminance and/or refresh rate than it would otherwise have. Thus, to date, electron beam deposition systems have not been generally useful to create low impedance refractory metal films on large substrates.

In theory, it is possible to increase the power of the electron beam to achieve a higher rate of vaporization and transfer. However, there are severe practical limitations to using this approach. A problem of excessive electron beam power is that instead of evaporating the metal to create a metal vapor, the beam will cause particles of unevaporated bulk material (macro-particles) to eject from the crucible and be deposited on the substrate. These lumps of material will cause electrical shorts in the conductive film layer, making the finished product unacceptable. The same problem typically arises when a single laser is used to vaporize a material, namely, the energy density of the laser required for vaporization will cause ejection of macro-particles.

Moreover, as prior noted, current electron gun equipment typically emits "Soft" X-Rays. Current electron gun equipment is not capable of processing large substrates, or delivering an electron beam at a power level necessary to obtain the high transfer rates needed to minimize formation of metal oxides in the vapor deposition process, because such power levels would emit "hard" X-Rays, obviously this is extremely dangerous. "hard" X-Rays pass through most materials, where as "soft" X-Rays do not penetrate glass or metal.

Some substrates such as silicon wafers, are sensitive to "Soft" X-Ray damage.

In theory, it is also possible to use a large number of electron beam source guns targeted at separate crucibles to achieve a higher mass transfer rate. However, in current single gun systems, when depositing refractory metal thin films the rate is typically ≈1/sec at the substrate and the process requires a minimum of ≈45/sec. Preferably, for minimized oxidation, the rate is 85/sec to achieve a low impedance film. Thus the theory of using multiple guns would obviously not work because such systems face practical difficulties in maintaining and coordinating the control of forty-five independent electron beam sources to insure an even delivery of metal vapor. Typically, the magnetic fields used to control one electron beam will tend to affect the control of the other electron beam, making the necessary level of precision manufacturing impossible to achieve, not to mention the cost of implementation. Moreover, such a system would require a complex and awkward movement of the substrate to attain a uniform coating. A system utilizing a great number of guns will still not attain the necessary deposition rate per unit area that is required to achieve conductive low impedance (i.e., as close to or equal to bulk material impedance) refractory metal thin films.

SUMMARY OF THE INVENTION

It is an object of the invention to provide a laser and laser-assisted free electron beam deposition apparatus and method that provides a high transfer rate useful in vapor deposition of numerous and/or large substrates.

It is an object of the invention to provide a laser and laser-assisted electron beam deposition apparatus and method that reduces formation of metal oxides during vapor deposition.

It is an object of the invention to provide a laser and laser-assisted electron beam deposition apparatus and method that minimizes problems of ejection of particles of unsublimated and/or unevaporated bulk material from the crucible.

It is an object of the invention to provide a laser and laser-assisted electron beam deposition apparatus and method that permits manufacture of high quality thin films.

It is an object of the invention to provide a laser and laser-assisted electron beam deposition apparatus and method that provides multiple high energy beams, both optical and electron, all used for evaporation of the material in one crucible.

It is an object of the invention to provide a laser and laser-assisted electron beam deposition apparatus and method that can be operated numerous consecutive times without requiring replacement of optical components coated with vaporized metals.

It is an object of the invention to provide a laser and laser-assisted electron beam deposition apparatus and method that may reduce X-Ray emission.

It is an object of the invention to provide a multi-beam deposition apparatus and method that may use multiple optical beams all used for evaporation of the material in one crucible.

In accordance with the present invention, a multi-beam deposition apparatus for vaporizing a material contained in a crucible to coat a thin film of the material on a substrate comprises a first laser and a second vaporizing apparatus selected from the group consisting of electron beam apparatus and a second laser. The first laser is located outside of the vacuum deposition chamber, which contains the crucible and the substrate. The laser is provided with means for directing, collimating, and focusing a high energy laser beam emitted by the laser into the crucible. The second vaporizing apparatus may consist of a laser generally similar to the first laser or an electron gun located in the chamber. Means for independently controlling the operation of the first laser and the second vaporizing apparatus are provided. The multi-beam deposition apparatus provides the energy of the first laser beam to heat the material, then the second vaporizing apparatus (second laser or electron beam) is used to vaporize the material to generate a molecular vapor flux, without the problems of particle ejection associated with very high energy density electron or laser beams. The combined energy of the first laser and the second vaporizing apparatus provides the high mass transfer rates of evaporated/sublimated material desirable to coat a substrate with minimal oxidation of the film material.

An aperture apparatus is preferably provided to permit introduction of the laser beam(s) into the chamber without downtime to clean deposited metal on the optics needed to transmit the beam into the crucible. It is to be appreciated that in normal laser beam or electron beam operation, the evaporated/sublimated metals will tend to coat the exposed optics of the laser, preventing the laser beam from providing energy to the crucible. The aperture apparatus solves this problem by providing a mechanism for continuous cleaning of the optical area that is transmitting the laser beam(s) into the crucible.

The aperture apparatus comprises a housing for mounting inside the deposition chamber, which has an aperture located whereby the incident laser beam may be directed through the aperture to the crucible. A rotatable disc, which is capable of transmitting the incident laser beam, is provided in the housing so that the incident laser beam may be directed along a path through the aperture in the housing. Means for rotating the disc are provided so that the incident laser beam is not continuously directed at the same position on the disc. A disc cleaning energy beam is directed inside the housing onto the disc to clear deposited material on the disc at a location on the disc which is in advance of the path of the incident laser beam. As the disc rotates, this cleared location is rotated into the path of the incident laser beam, permitting unimpeded transmission of the incident laser beam. In this position, the location becomes subject to deposition of vaporized material, but is then rotated out of the path of the metal vapor flux and cleaned by the disc cleaning energy beam before being rotated back into the path of the incident laser beam. The housing shields the disc from deposition of material other than at the aperture. The disc is preferably formed from fused silica and is an optical flat. The disc cleaning energy beam is preferably a laser beam.

Other objects, aspects and features of the present invention in addition to those mentioned above will be pointed out in or will be understood from the following detailed description provided in conjunction with the accompanying drawings.

BRIEF DESCRIPTION OF THE DRAWINGS

FIG. 4 is a schematic top view of an embodiment of the laser deposition apparatus of the invention.

DETAILED DESCRIPTION OF THE PREFERRED EMBODIMENT

Figure 1:
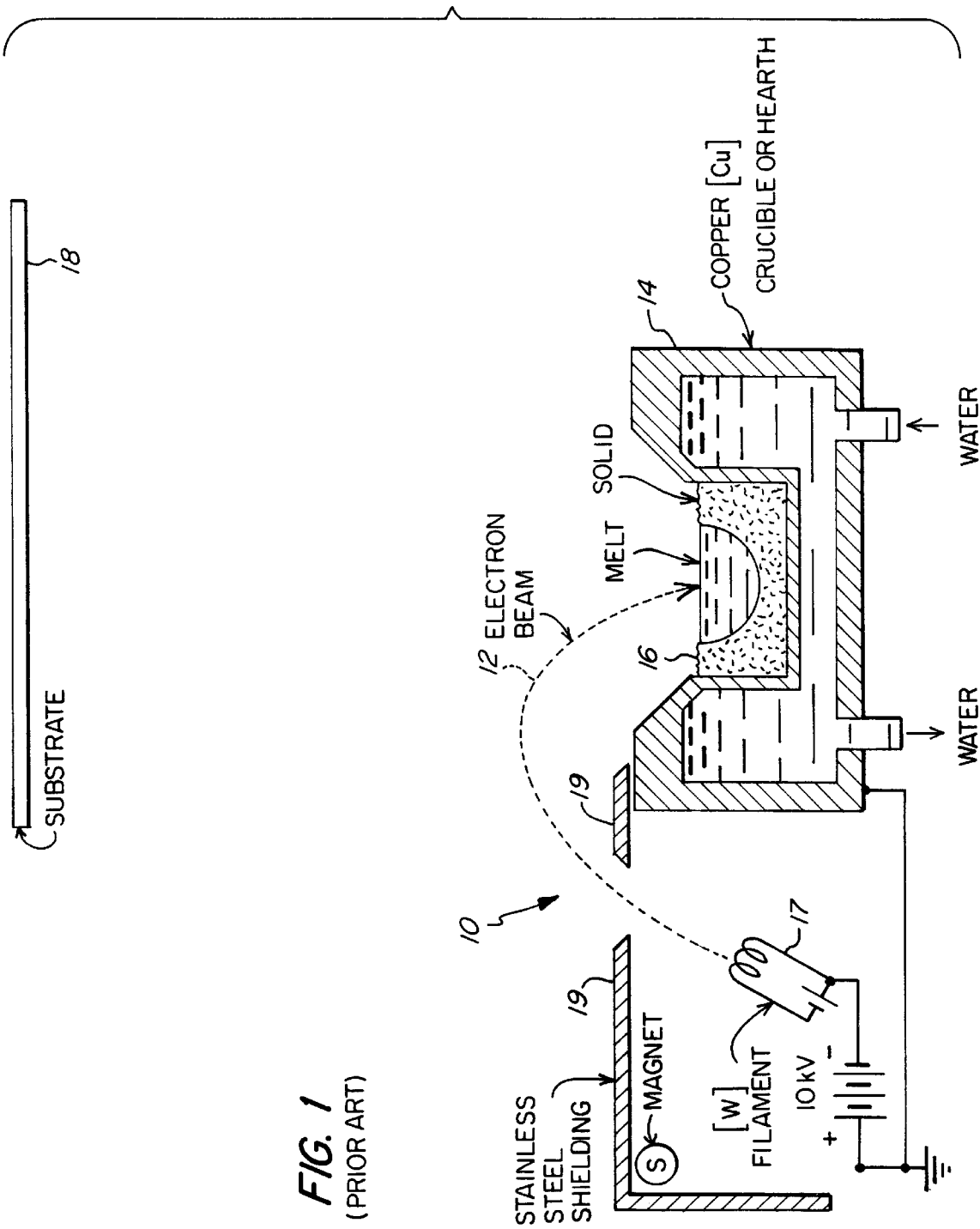
FIG. 1 is a cross-sectional view of a conventional prior art electron beam deposition gun apparatus.
Figure 2:
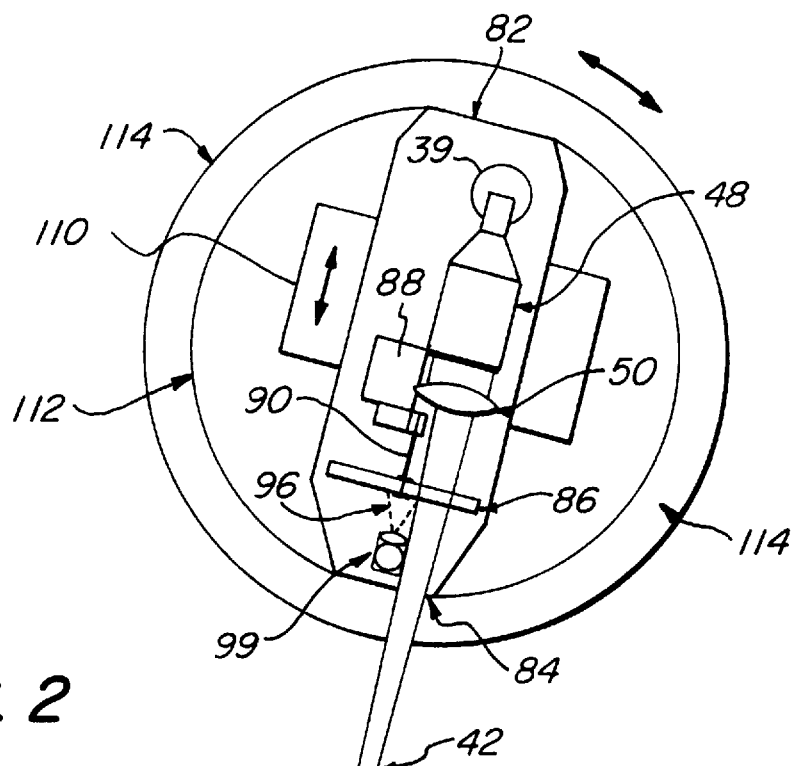
FIG. 2 is a schematic top view of an embodiment of the laser assisted free electron beam deposition apparatus of the invention.
Figure 2:
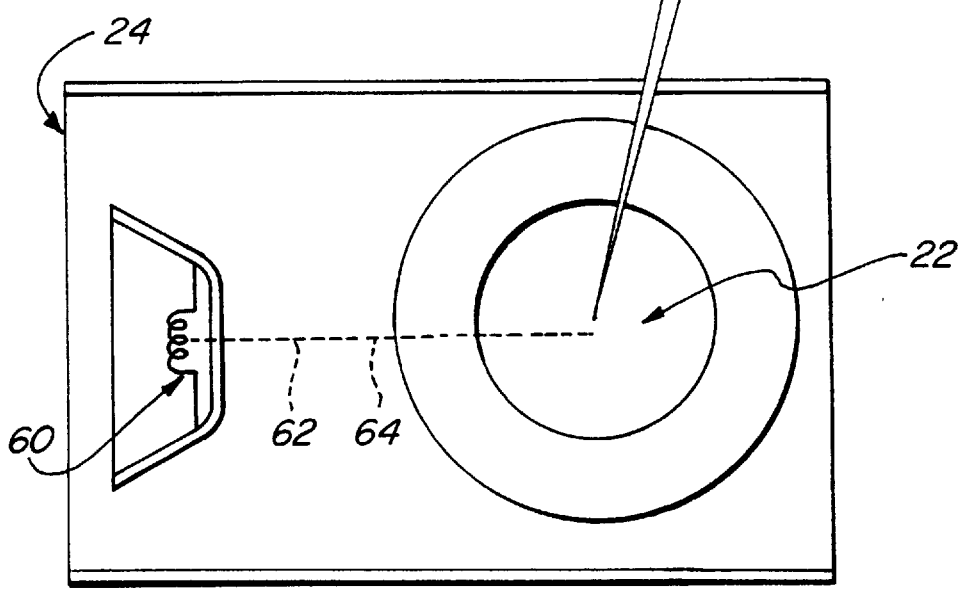
Figure 3:
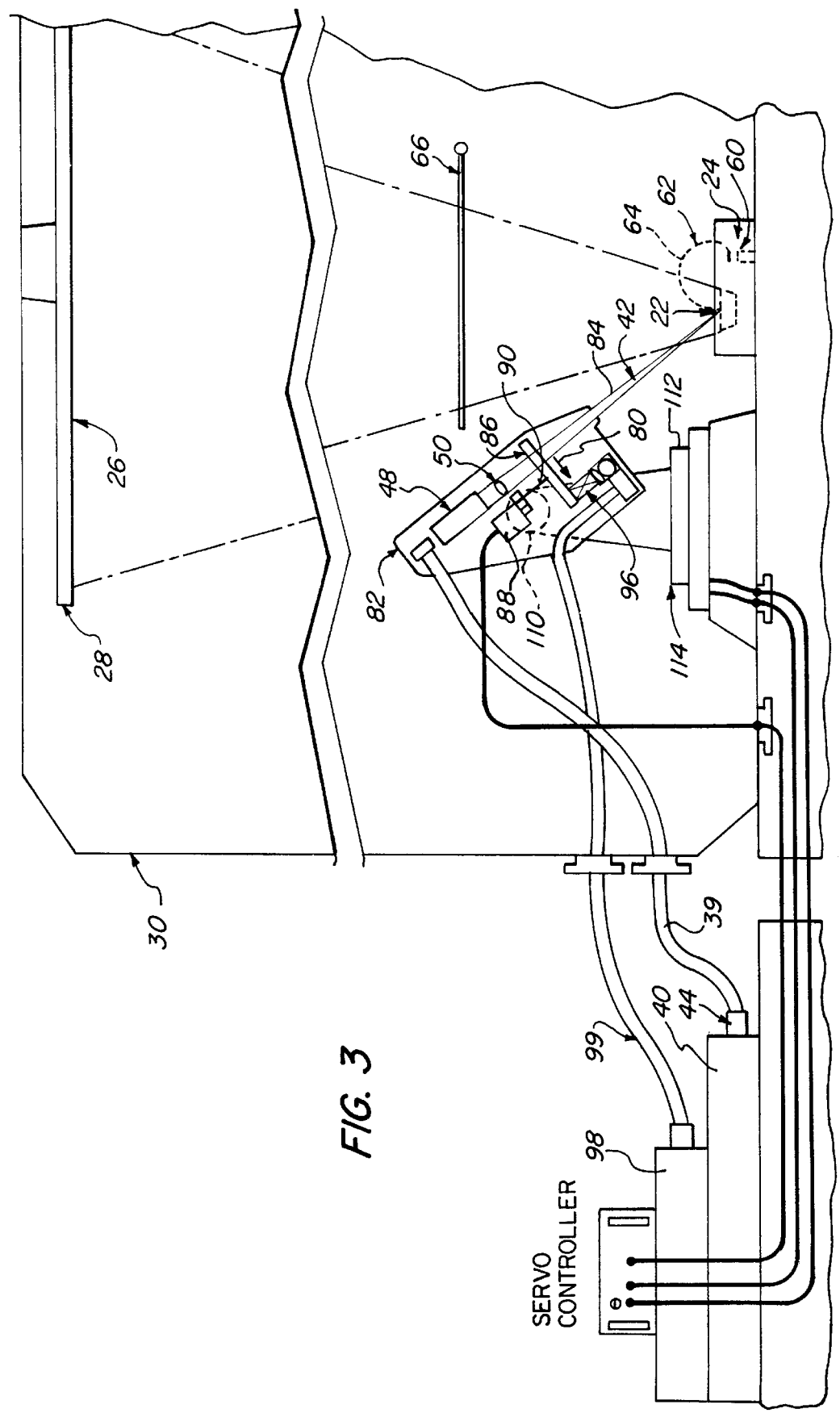
FIG. 3 is a schematic side elevation view of an embodiment of the laser-assisted free electron beam deposition apparatus of the invention.

Referring now to FIG. 2–4, where like elements are identified by like numbers in the drawings, a multi-beam deposition apparatus 20 is shown. Apparatus 20 is intended to be operated to vaporize a material 22 contained in crucible 24 to coat a thin film 26 of the material on a substrate 28. The composition of material 22 will vary depending upon the product to be manufactured. In the case of flat panel displays, material 22 could be molybdenum or another refractory metal. However, in other applications, such as the manufacture of semiconductors, the material 22 may be tungsten, titanium, or chrome. The crucible 24 is formed of oxygen free, high conductivity, water cooled copper material. Crucible 24 is located in a vacuum chamber 30 referred to herein as the deposition chamber.

Apparatus 20 comprises a first laser 40 and a second vaporization apparatus selected from the group consisting of an electron beam generating apparatus and a second laser. In FIGS. 2–3 the second vaporization apparatus is an electron beam generating apparatus 60. In FIG. 4 the second vaporization apparatus is a second laser 140.

First laser 40 is a high energy laser, such as a multi-kilowatt Nd:YAG laser operating at a $\lambda$ of 1.06 $\mu$m. or a Krypton Fluoride [KrF] EXCIMER laser operating at a $\lambda$ of 248 $\mu$m pulsed at a length of 20 nano seconds. Other suitable lasers can include solid state lasers such as Ti: Sapphire lasers; Nd:YLF lasers; Nd: VO4 lasers; Nd: Glass lasers; and gas lasers such as $CO_2$ lasers. Laser 40 is located outside of chamber 30 and the laser beam 42 is directed into the chamber and into the crucible. As shown in FIG. 3, the first laser beam 42 is preferably down collimated and corrected for divergence, then directed using a fiber-optic cable 39. The first laser beam 42 is then up collimated to a desired beam diameter in collimator 48 and focused with lens 50 through aperture apparatus 80 into the crucible 24. The targeting of laser beam 42 is controlled by mounting the down collimator focussing lens and aperture apparatus 80 on a pivoting mount 110 which in turn sit on a turntable 112. The pivot mounting 110 and turntable 112 are provided with servomotors to allow precise positioning of the laser beam 42 on the target. Further, the assembly 114 that contains the pivoting and turning structures 110, 112 is computer servo controlled to sweep the laser beam 42 across a target area of crucible 24 to provide uniform heating and/or evaporation/sublimation of the material.

Electron beam generating apparatus 60 shown in FIGS. 2 and 3 is preferably a conventional electron gun. A conventional electron gun has an electron source in which electrons are generated from an indirectly heated filament and which pass through a magnetic field which focuses and controls the electron beam to sweep the source material in the crucible 24. Typically, the crucible 24 is charged with a positive voltage potential which attracts the electron beam to the crucible 24.

The electron beam 62 and the laser beam 42 are directed to the crucible 24 along separate paths 64 and 52 respectively whereby the laser beam 42 and the electron beam 62 are non-interfering except in the crucible 24. This is not a negative aspect. The magnetic fields and the electron beam have no effect on the laser beam(s) and the laser beam(s) have no effect on the electron beam or magnetic fields. The different beam physics allows this unique implementation.

The deposition apparatus 20 of FIGS. 2 and 3 thus provides the energy of the first laser beam 42 in addition to the energy of the electron beam 62 to heat the material 22 and to cause it to vaporize without the problem of macro-particle ejection associated with high energy density electron beams, and permits operation of both the optical beam 42 and the electron beam 62 at an energy density level that minimizes the possibility of macro-particle ejection. The combined energy of the laser and electron beam 42, 62 provides the high mass transfer rates desirable to coat the substrate 28 with minimal oxidation of the material.

The energy of the laser beam 42 and electron beam 62 will cause the material to evaporate/sublimate and to rise from the crucible. A shutter 66 is provided to allow source power ramp/soak step programming. Under this programming, the energy input to the material can be increased in stages, allowing for the entire material to reach an equilibrium temperature before increasing the energy to a higher level.

The shutter 66 is triggered by a crystal oscillator to open when the crystal oscillator detects that the flux rate of the material has reached the necessary rate to begin the coating of the substrate.

It is to be appreciated that although the foregoing description discusses the invention in terms of a single first laser 40 and a single second vaporizing apparatus, the apparatus may employ one or more first lasers 40 as well as one or more electron beam generating apparatus 60 (or second lasers 140 described hereafter), depending on the thermal characteristics of the material to be vaporized, the size of the substrate to be coated, the desired molecular flux rate of the vaporized material and other factors. Generally, the limitations on the number of components will be determined by the physical space available to locate such components in the chamber, and the ability to coordinate and control the components.

In the present invention, the laser 40 and electron beam generating apparatus 60 are preferably programmed to be independently controlled. Thus, the length of time of operation, and the start time and stop time for each of the laser 40 and electron beam generating apparatus 60 may be independently controlled. These timing controls may be software implemented or be set with timing hardware. Similarly, the electron beam power is to be controlled independently of the laser beam power. The position at which each beam strikes and scans the material 22 in crucible 24 is also programmed to be independently controlled as described above.

Although each of the laser 40 and the electron beam generating apparatus is independently software controlled, these controls may in turn be made subject to a single computer control program to coordinate the operation of the two components. Thus, depending on the material to be evaporated/sublimated, the size of the substrate, the power of the laser beams 42, the power of the electron beam 62, and other variables, it may be desirable to provide a staged energy input to the material by operation of the laser 40 and electron beam source 60 at selected intervals. For example, it may be desirable to initiate the deposition process by preheating the material 22 with the laser 40 prior to initiating the electron beam 62.

However, in most cases, it is anticipated that simultaneous operation of the laser 40 and electron beam source 60 will be the preferred mode of operation as it maximizes energy transfer to the material 22 and will provide the maximum rate of mass transfer to the substrate 28, thereby reducing the possibility of macro-particle ejection or oxidation of the film material 22. A single master computer in control of the slave laser computer 40 and the slave electron beam power supply computer in control of source 60 with crystal oscillator feed back, will be particularly helpful in this mode of operation.

The respective energy inputs of the laser 40 and the electron beam source 60 will depend on the material 22, the desired rate of mass transfer, and the distance between the material 22 in crucible 24 and the substrate. In applications such as deposition of refractory metals such as tungsten, it is anticipated that the laser 40 will provide between about 60% to about 80% of the required energy, and preferably about 45% to about 75% of the required energy. The electron beam source 60 will provide between about 20% to about 40% of the desired energy and preferably about 15% to about 45% of the desired energy.

It is my belief that the present invention will allow operation of the electron beam apparatus at a sufficiently low power level, so as to reduce and possibly eliminate the X-Ray emission, typical of electron beam apparatus. This beneficial effect would make the apparatus and process of the invention suitable for use in manufacture of delicate semiconductor products, such as integrated circuits and/or other products sensitive to X-Ray damage.

EXAMPLE 1

An example of the operation of multi-beam deposition apparatus 20 is as follows. The deposition chamber is provided with a substrate 28 located ≈20 inches above the tungsten material source located in crucible 24. Laser 40 is a 3-kW Nd:YAG laser operating at a $\lambda$ of 1.06 $\mu$m with a 6 mm diameter beam. The electron beam generating apparatus is operating to provide 1 A of emission current accelerated through a 10-kV voltage drop, thus 10-kW is delivered upon impact. The apparatus 20 will achieve a deposition rate of ≈45 angstroms/second at the substrate. A required film thickness of a flat panel display may be ≈3000 angstroms. The apparatus 20 will therefore be operated for ≈73.5 seconds to achieve the desired film thickness.

Referring now to FIG. 4, the apparatus 20 may, in an alternate embodiment, comprise a first laser 40 and a second laser 140. First laser 40 is identical to that described in FIGS. 2–3. Second laser 140 is also similar to laser 40 as described in FIGS. 2–3. As noted above, there may be more than one first laser 40 and more than one second laser 140 if necessary to obtain the desired vaporization. In the embodiment of FIG. 4, the same control mechanisms described above will be used.

As has been prior noted, the vaporized material has a tendency to coat anything in its path. In order to minimize the likelihood of coating the optics of the incident laser beams 42 and 142 in the chamber 30 with undesirable material, an aperture apparatus 80, as illustrated in FIGS. 2–4 is preferably provided. The aperture apparatus provides a mechanism for continuous cleaning of the optical components that transmits the laser beams 42, 142 into the chamber 30.

The aperture apparatus 80 comprises a housing 82 mounted inside the deposition chamber 30, a rotatable optical flat disc 86, and an optical flat disc cleaning energy beam 96.

Housing 82 is preferably formed of stainless steel, and tightly fitted to the assembly 114. The only opening exposed to the source in housing 82 is an aperture 84. Aperture 84 is located so that the laser beams 42, 142 may be directed through the aperture 84 into the crucible 24.

Disc 86 is made of a material capable of transmitting the laser beam 42, and preferably is made of IR grade fused silica glass, with an anti-reflective coating on the incident laser beam input side, which is indexed matched to the specific laser in use. As used herein, "disc" 86 is preferably a circular (optical flat) planar sheet of uniform thickness glass, however, the disc may comprise other shapes and may be of non-uniform thickness, and would be within the scope of the invention.

Disc 86 is located inside housing 82. Disc 86 is provided with means for rotation, such as a servo motor 88, either directly coupled to disc 86 or connected by appropriate gearing or belt drives and bearings to provide a desired rotation speed, and is supported by axle 90. The rotation of disc 86 has the effect that laser beams 42, 142 are not continuously directed at a same spot position on disc 86.

Laser beams 42, 142 are directed by fiber optic cable 39 and collimator 48 to pass through disc 86, through aperture 84 into crucible 24.

As the vaporization of material 22 takes place, a small amount of material will enter housing 82 through aperture 84 and be deposited on the surface of disc 86 at a position adjacent the aperture 84. As this is the same area of the disc 86 that the incident laser beams 42, 142 are directed, it is necessary to clean the surface of disc 86 where the material 22 is deposited. A disc cleaning energy beam 96 is therefore provided and is directed inside the housing 82 onto the disc 86 to clear deposited material on the disc 86. Energy beam 96 is preferably a laser beam. Preferably the disc cleaning laser beam is provided by an ≈1-kW Nd:YAG laser operating at a $\lambda$ of 1.06 $\mu$m, or is a beam split from the incident laser.

The disc cleaning laser beam 96 is preferably generated by a laser 98 and is transmitted into the chamber 30 through a fiber optic cable 99, and directed to the location of a servo controlled apparatus 114 which also contains the collimator and focusing optics. This system rapidly sweeps the incident laser beam's track evaporating any deposited material. Also the scanner is tied into the system computer for synchronized control. Conveniently, the disc cleaning laser beam 96 may be directed to a point on the disc from about 10 to about 180 degrees in advance of the position at which the incident laser beam 42 passes through disc 86, although any location may be used. Of course, the disc cleaning laser beam 96 will be directed to a position the same radial distance from the center of disc 86 but the opposite side as the position where the incident laser beam 42 passes through disc 86. In effect, the disc cleaning laser beam 96 is directed at a position on the disc which is in advance of the path of the incident laser beams 42, 142. The disc cleaning laser evaporates the material 22 which is allowed to condense on other areas of the disc 86. As the disc 86 rotates, this cleared location is rotated into the path of the incident laser beams 42, 142, thus providing a clear path for incident laser beams 42, 142. When in this position, the cleared location again becomes subject to deposition of vaporized material 22, but it is then rotated out of the path of the vapor flux and cleaned by the disc cleaning laser beam 96 before being rotated back into the path of the incident laser beam 42. The housing 82 shields the disc 86 from deposition of material other than at the aperture 84.

Referring to Example 1 described above, the distance from crucible 12 to aperture 84 is selected to be ≈10 inches. At this distance from the crucible, the deposition rate of vaporized material is higher than at the substrate 28, and will be on the order of ≈180 angstroms/second. If a permissible deposition build up on disc 86 is limited to ≈10 angstroms, and the incident laser beam 42 passes through disc 86 at a location about 3 inches from the disc center, disc 86 will be required to rotate at a speed no greater than about 300 rpm to prevent excessive build-up of evaporant material on disc 86.

The present invention therefore provides a new and useful vapor deposition apparatus and method which permits very high rate vapor deposition of refractory metal, or ceramic thin films with reduced metal oxide formation and minimal ejection of macro-particles, and the ability to process large substrates and obtain low impedance refractory metal thin films.

It is to be appreciated that the foregoing is illustrative and not limiting of the invention, and that various changes and modifications to the preferred embodiments described above will be apparent to those skilled in the art. Such changes and modifications can be made without departing from the spirit and scope of the present invention, and it is therefore intended that such changes and modifications be covered by the following claims.

What is claimed is:

1. A vapor deposition apparatus for vaporizing a material contained in a crucible contained in a deposition chamber to coat a thin film of the material on a substrate contained in the deposition chamber, comprising:
    a first laser located outside of the deposition chamber provided with means for directing a first laser beam emitted by said laser to the crucible;
    a second vaporizing beam apparatus selected from the group consisting of at least one electron beam generating apparatus and at least one second laser provided with means for directing a vaporizing beam generated by said second vaporizing beam generating apparatus to the crucible.

2. A vapor deposition apparatus in accordance with claim 1, wherein said second vaporizing beam generating apparatus consists of at least one electron beam generating apparatus.

3. A vapor deposition apparatus in accordance with claim 1, wherein said second vaporizing beam generating apparatus consists of at least one second laser.

4. A vapor deposition apparatus in accordance with claim 1, further comprising a means for cleaning an area through which said laser beam is directed into the deposition chamber to remove accumulation of material on said area.

5. A vapor deposition apparatus in accordance with claim 4, wherein said cleaning means is an aperture apparatus, comprising:
    a housing for mounting inside the deposition chamber, said housing having an aperture located whereby said laser beam may be directed through said aperture to said crucible;
    a disc located inside said housing which disc is formed of a material which is capable of transmitting said laser beam, whereby said laser beam may be directed along a path through said disc and to said aperture in said housing;
    means for providing rotation of said disc whereby said laser beam is not continuously directed at a same position on said disc;
    a disc cleaning energy beam directed inside said housing to said disc to clear deposited material on said disc at a location prior to rotation of said location into said path of said laser beam through said disc.

6. A vapor deposition apparatus in accordance with claim 5, wherein said disc comprises a planar circular disc of fused silica, and said disc cleaning energy beam comprises a laser beam.

7. A vapor deposition apparatus for vaporizing a material contained in a crucible contained in a deposition chamber to coat a thin film of the material on a substrate contained in the deposition chamber, comprising:
    at least one laser located outside of the deposition chamber provided with means for directing a high energy laser beam emitted by said laser into the crucible;
    means for controlling operation of said laser;
    at least one an electron beam generating apparatus with means for directing the electron beam generated by said electron beam generating apparatus to the crucible;
    means for controlling operation of said electron beam generating apparatus;
    said electron beam and said laser beam being directed to said crucible;
    said laser beam providing sufficient energy to said material whereby said material may be vaporized by said electron beam with minimal ejection of material particulates, to coat the substrate with minimal oxidation of said material in said coating.

8. A vapor deposition apparatus in accordance with claim 7, wherein said electron beam generating apparatus is operated at a power level sufficiently low to provide minimal X-ray emissions.

9. A vapor deposition apparatus in accordance with claim 8, further comprising a means for cleaning an area through which said laser beam is directed into the deposition chamber to remove accumulation of material on said area.

10. A vapor deposition apparatus in accordance with claim 9, further comprising:
    a housing for mounting inside the deposition chamber, said housing having an aperture located whereby said laser beam may be directed through said aperture to said crucible;
    a disc located inside said housing which disc is formed of a material which is capable of transmitting said laser beam, whereby said laser beam may be directed along a path though said disc and through said aperture in said housing;
    means for providing rotation of said disc whereby said laser beam is not continuously directed at a same position on said disc;
    a disc cleaning energy beam directed inside said housing to said disc to clear deposited material on said disc at a location prior to rotation of said location into said path of said laser beam.

11. A vapor deposition apparatus in accordance with claim 10, wherein said disc comprises a planar circular disc of fused silica, and said disc cleaning energy beam comprises a laser beam.

12. A vapor deposition apparatus for vaporizing a material contained in a crucible contained in a deposition chamber to coat a thin film of the material on a substrate contained in the deposition chamber, comprising:
    at least one first laser provided with means for directing a high energy first laser beam emitted by said first laser into the crucible;
    means for controlling operation of said first laser;
    at least one second laser provided with means for directing a high energy second laser beam emitted by said second laser to the crucible;
    means for controlling operation of said second laser;
    said first and second laser beams being directed to said crucible;

said first laser beam providing sufficient energy to said material whereby said material may be vaporized by said second laser beam with minimal ejection of material particulates, to coat the substrate with minimal oxidation of said material in said coating.

13. A vapor deposition apparatus in accordance with claim 12, further comprising a means for cleaning an area through which said laser beams are directed into the deposition chamber to remove accumulation of material on said area.

14. A vapor deposition apparatus in accordance with claim 13, further comprising, for each of said first and second lasers:
- a housing for mounting inside the deposition chamber, said housing having an aperture located whereby said laser beam may be directed through said aperture to said crucible;
- a disc located inside said housing which disc is formed of a material which is capable of transmitting said laser beam, whereby said laser beam may be directed along a path though said disc and through said aperture in said housing;
- means for providing rotation of said disc whereby said laser beam is not continuously directed at a same position on said disc;
- a disc cleaning energy beam directed inside said housing to said disc to clear deposited material on said disc at a location prior to rotation of said location into said path of said laser beam.

15. In a beam deposition apparatus for vaporizing a material contained in a crucible contained in a deposition chamber to coat a thin film of the material on a substrate contained in the deposition chamber, an aperture apparatus for a laser beam directed at said crucible to vaporize the material, comprising:
- a housing for mounting inside the deposition chamber, said housing having an aperture located whereby said laser beam may be directed through said aperture to said crucible;
- a disc located inside said housing which disc is formed of a material which is capable of transmitting said laser beam, whereby said laser beam may be directed along a path through said disc and to said aperture in said housing;
- means for providing rotation of said disc whereby said laser beam is not continuously directed at a same position on said disc;
- a disc cleaning energy beam directed inside said housing to said disc to clear deposited material on said disc at a location prior to rotation of said location into said path of said laser beam through said disc.

16. In a beam deposition apparatus in accordance with claim 15, wherein said disc comprises a planar circular disc of fused silica, and said disc cleaning energy beam comprises a laser beam.

17. A process of vapor deposition of a material on a substrate, in a deposition chamber containing the substrate and a crucible in which is located the material to be deposited on the substrate, comprising:
- generating a laser beam of selected power and directing said laser beam into said crucible;
- generating an electron beam of selected power and directing said electron beam into said crucible;
- said laser beam providing sufficient energy to said material whereby said material may be vaporized by said electron beam, with minimal ejection of material particulates, to coat the substrate with minimal oxidation of said material in said coating.

18. A process in accordance with claim 17, wherein said laser beam and said electron beam are operated simultaneously to provide a desired energy input to said material.

19. A process in accordance with claim 17, wherein said laser beam and said electron beam are operated at selected intervals to provide a staged input of energy to said material to minimize ejection of macro-particles of said material from said crucible.

20. A process in accordance with claim 19, wherein said electron beam is generated at a sufficiently low power level to minimize X-ray emissions.

21. A process of vapor deposition of a material on a substrate, in a deposition chamber containing the substrate and a crucible in which is located the material to be deposited on the substrate, comprising:
- generating a first laser beam of selected power and directing said first laser beam into said crucible;
- generating a second laser beam of selected power and directing said second laser beam into said crucible;
- said first laser beam providing sufficient energy to said material whereby said material may be vaporized by said second laser beam, with minimal ejection of material particulates, to coat the substrate with minimal oxidation of said material in said coating.

22. A process in accordance with claim 21, wherein said first laser beam and said second laser beam are operated simultaneously to provide a desired energy input to said material.

23. A process in accordance with claim 21, wherein said first laser beam and said second laser beam are operated at selected intervals to provide a staged input of photon energy to said material to minimize ejection of macro-particles of said material from said crucible.

* * * * *